(12) United States Patent
Ehmke et al.

(10) Patent No.: US 10,621,385 B2
(45) Date of Patent: Apr. 14, 2020

(54) DEVICE AND METHOD FOR DETERMINING GEOMETRY CHARACTERISTIC VALUES OF A WHEEL PROFILE ON A ROLLING WHEEL OF A RAIL VEHICLE

(71) Applicant: Schenck Process Europe GmbH, Darmstadt (DE)

(72) Inventors: Fritz Ehmke, Modautal-Luetzelbach (DE); Viktor Rais, Modautal (DE)

(73) Assignee: Schenck Process Europe GmbH, Darmstadt (DE)

( * ) Notice: Subject to any disclaimer, the term of this patent is extended or adjusted under 35 U.S.C. 154(b) by 576 days.

(21) Appl. No.: 15/444,947

(22) Filed: Feb. 28, 2017

(65) Prior Publication Data

US 2017/0169145 A1  Jun. 15, 2017

Related U.S. Application Data

(63) Continuation of application No. PCT/EP2015/001723, filed on Aug. 24, 2015.

(30) Foreign Application Priority Data

Aug. 29, 2014 (DE) .......................... 10 2014 012 564

(51) Int. Cl.
*G06F 17/50* (2006.01)
*G06F 30/20* (2020.01)
(Continued)

(52) U.S. Cl.
CPC ............ *G06F 30/20* (2020.01); *G01B 15/04* (2013.01); *G01M 17/10* (2013.01); *G01S 13/34* (2013.01)

(58) Field of Classification Search
CPC .... G06F 17/5009; G06F 30/20; G01M 17/10; G01S 13/34; G01B 15/04
(Continued)

(56) References Cited

U.S. PATENT DOCUMENTS 4,932,784 A   6/1990 Danneskiold-Samsoe
5,577,690 A  11/1996 Haddox
(Continued)

FOREIGN PATENT DOCUMENTS

DE        103 13 191 A1   10/2004
DE  10 2004 033 432 A1    2/2006
(Continued)

*Primary Examiner* — Eunhee Kim
(74) *Attorney, Agent, or Firm* — Muncy, Geissler, Olds & Lowe, P.C.

(57) ABSTRACT

A device for determining geometry characteristic values of a wheel profile on a rolling wheel of a rail vehicle that includes a first sensor arrangement, which has a first non-contact measuring distance sensor, which is oriented at a reference surface in the form of the inner planar surface of the rolling wheel, and at least one further non-contact measuring distance sensor, which is oriented at a defined angle of incidence at the wheel surface of the rolling wheel facing the rail or the wheel surface of the rolling wheel to be examined. Both distance sensors are arranged a defined distance to the rail. An electronic evaluation device calculates the geometry characteristic values from the detected distance signals. The first and the further non-contact measuring distance sensor use a frequency-modulated continuous-wave radar (FMCW), and a lens is used to bundle the radar waves and thus to define a measuring spot.

14 Claims, 3 Drawing Sheets

(51) Int. Cl.
*G01M 17/10* (2006.01)
*G01B 15/04* (2006.01)
*G01S 13/34* (2006.01)

(58) Field of Classification Search
USPC .......................................................... 703/8
See application file for complete search history.

(56) References Cited

U.S. PATENT DOCUMENTS

| | | | |
|---|---|---|---|
| 5,636,026 | A | 6/1997 | Mian et al. |
| 7,602,506 | B2 * | 10/2009 | Hoffmann .......... G01B 11/2522 356/601 |
| 2003/0072001 | A1 | 4/2003 | Mian et al. |
| 2003/0160193 | A1 | 8/2003 | Sanchez Revuelta et al. |
| 2006/0052928 | A1 * | 3/2006 | Kawasaki ................. G01P 3/49 701/93 |
| 2008/0088503 | A1 * | 4/2008 | Beasley ................ G01S 7/4056 342/200 |
| 2014/0277860 | A1 * | 9/2014 | Pulliam .................. B60L 15/20 701/19 |
| 2015/0005993 | A1 * | 1/2015 | Breuing ................. G01S 17/58 701/19 |
| 2016/0282108 | A1 * | 9/2016 | Martinod Restrepo .. B61K 9/12 |

FOREIGN PATENT DOCUMENTS

| | | |
|---|---|---|
| FR | 2 805 038 A1 | 8/2001 |
| WO | WO 92/00214 A1 | 1/1992 |
| WO | WO 2014 079695 A1 | 5/2014 |

\* cited by examiner

DEVICE AND METHOD FOR DETERMINING GEOMETRY CHARACTERISTIC VALUES OF A WHEEL PROFILE ON A ROLLING WHEEL OF A RAIL VEHICLE

This nonprovisional application is a continuation of International Application No. PCT/EP2015/001723, which was filed on Aug. 24, 2015, and which claims priority to German Patent Application No. 10 2014 012 564.5, which was filed in Germany on Aug. 29, 2014, and which are both herein incorporated by reference.

BACKGROUND OF THE INVENTION

Field of the Invention

The present invention relates to a device for determining geometry characteristic values of a wheel profile on a rolling wheel of a rail vehicle and to a method for measuring a wheel profile.

Description of the Background Art

The driving behavior of rail vehicles and their safety is essentially determined by the geometry of the wheel-rail contact. At the same time, this also affects the wear of the wheels and the rail, wherein the wear is substantially dependent on the track position, the curves and the running behavior of the railcars in the transverse direction (hunting oscillation).

The geometry characteristic values are defined by legal limits, i.e., minimum and maximum dimensions, which must be observed when operating rail vehicles. Therefore, the operators of rail vehicles are obliged to adhere to these limit values and to check the geometry characteristic values of the wheels of the rail vehicles at appropriate intervals.

In addition to condition monitoring of the wheels when stationary or in repair yards, wherein the wheels are manually scanned by means of measuring gauges, methods and devices are known in which the geometry of the wheel is detected when the vehicle is in motion.

For example, DE 10 2004 033 432 A1 discloses a device for measuring condition data on a rolling wheel set in which a non-contact measuring distance sensor is arranged in the rail head and further distance sensors are arranged horizontally along the rail, and in which the axial offset of a wheel or wheel set rolling by is determined over the determined distances.

However, in the solutions according to the conventional art, changes have to be made to a running rail, which is, on the one hand, complicated and, on the other hand, can lead to a limitation of the overrun speed.

From U.S. Pat. No. 5,577,690 A, a device for measuring the wheel flange of a wheel by means of microwaves is known in which a transmitter-receiver unit is arranged next to the rail below the wheel flange. The microwaves are transmitted by the transmitter in the vertical direction upwards onto the surface of the wheel flange and are reflected back from the wheel flange onto the receiver. This is intended to indirectly determine the wheel flange height and therefore, the wear on the tread. A disadvantage of this arrangement, however, is that the measuring results are error-prone; that the hunting oscillation of the rail-bound vehicle cannot be taken into account.

Furthermore, laser-assisted overrun measuring devices for detecting the wheel profile of rail-bound vehicles are known.

The sensors are arranged in a closed housing for protection against environmental influences. An existing opening flap or a slide on the protective housing must be opened above the measuring system shortly before the train enters the station in order to make the measurement possible.

Furthermore, a laser-assisted method for determining wheel geometry characteristic values is known from U.S. Pat. No. 5,636,026 A, in which a laser beam is directed to a point of a wheel profile and its reflection is detected in order to subsequently compare the detected signals with the stored signals of an undamaged wheel.

However, a disadvantage of laser measurement methods is that they are susceptible to errors in the event of rain, snow, changes between light and shade, direct sunlight and dust, and therefore can deliver incorrect or inaccurate measurement results.

SUMMARY OF THE INVENTION

It is therefore an object of the present invention to reliably determine the geometry characteristic values of a rolling wheel of a rail-bound vehicle during transit and its state of wear.

The invention provides a device for determining geometry characteristic values of a wheel profile on a rolling wheel of a rail vehicle having at least a non-contact measuring distance sensor, which is arranged at a distance a from the rail, an electronic evaluation device for calculating the geometry characteristic values from the detected distance signals, and a display unit. In the device according to the invention, the first non-contact measuring distance sensor in the form of an FMCW radar sensor for detecting the geometry characteristic values, preferably orthogonal to a reference surface on the rolling wheel, and at least one further non-contact measuring distance sensor in the form of an FMCW radar sensor at a defined angle of incidence, are oriented towards the wheel surface rail of the rolling wheel facing the rail or to be examined.

A frequency-modulated continuous wave radar or FMCW radar is a radar system which differs from a pulse radar in that the transmitter of a continuous wave radar operates continuously during the duration of the measuring operation. In this context, frequency-modulated continuous wave radars often operate with a periodic frequency modulation, which must be as time-linear as possible to meet high standards of accuracy of measurement.

This means that relative to the transmission signal, the receive signal is delayed in each case by the runtime 2r/c. The frequency of the radar transmitter has changed during the time $\Delta t=2r/c$ which the transmitted continuous wave radar signal requires to travel the distance r to and from the reflecting object at the speed of light c. The magnitude of the frequency difference is accordingly a measure for the runtime and the distance of the transmitter/receiver unit and the reference point or target object.

The faster the frequency is changed, i.e. the greater the gradient of the frequency change df/dt, the greater the frequency difference for a given time difference, whereby the range resolution of the continuous wave radar or FMCW radar improves.

Accordingly, in the case of linear frequency modulation, to the extent that the Doppler frequency can be ignored, the magnitude of the frequency distance $\Delta f$ between transmission and receive signal at each point in time is a measure for the runtime $\Delta t$ and thus for the distance of the reference point or the target object from the transmitter/receiver unit.

The signal processing essentially includes the measurement of the differential frequency Δf, which results from the mixing of the echo signal and the actual transmission frequency.

The choice of the parameter "frequency change" is, however, a compromise between range, accuracy and the distance resolution of the continuous wave radar or FMCW radar and thus of the diagnostic system.

The non-contact measuring distance sensors in the form of FMCW radar sensors based on microwaves are significantly more resistant and less susceptible to the effects of rain, snow, ice and dust as compared to laser-based sensors. Furthermore, the results are not affected by changes in the light or shade, solar radiation, air flickering or heat radiation. As a result, the device according to the invention for the determination of geometry characteristic values or their associated sensor arrangement can be installed in the open air or on the open railway track. In order to improve the measuring accuracy, it is advantageous to bundle the radar or microwaves, so as to avoid too much scattering during their reflection. Therefore, the invention provides a lens for bundling the radar waves and thus for defining a so-called measuring spot.

For the determination of the wear state of a wheel profile, the geometry characteristic values of the wheel flange height $S_h$, the wheel flange width $S_d$ and the wheel flange gradient $q_r$ are diagnosed. The output values of the wheel geometry required for the calculation of these characteristic values are obtained by means of distance measurement between the radar sensor and the wheel surface. Accordingly, the further radar sensor(s) are directed to the tread, the hollow groove and/or the wheel flange flank of the rolling wheel. By means of their arrangement, the contour on the wheel surface or on the wheel profile can be detected and evaluated during measurement for each sensor at an agreed sampling rate relative to the driving speed.

Since the definition of the aforementioned geometry characteristic values is based on reference points on the wheel profile, it is a challenge to detect the associated output values during transit or during the passing of the wheel. The reference points for the geometry characteristic values are, on the one hand, the wheel back from which the wheel flange width $S_d$ is measured and, on the other hand, the measuring circuit axis via which the wheel flange height $S_h$ and the wheel flange gradient $q_r$ are determined. With appropriate expansion of the sensors, the wheel diameter can also be determined. Accordingly, the evaluating device of the device according to the invention for processing the signals of the sensors is provided in the form that the geometry characteristic values of the wheel profile such as the wheel flange height $S_h$, the wheel flange width $S_d$, the wheel flange gradient $q_r$ and the wheel diameter are determined from the respectively measured distances to the individual points of the wheel profile.

It is therefore advantageous that the first radar sensor is arranged on one side of the rail, preferably on the wheel back, and the other radar sensor(s) is/are provided on the other side of the rail. In this way, an accurate determination of the geometry characteristic values in the tenth millimeter range can be performed with the aid of the evaluating device and the measured distances, even in the case of hunting oscillation of the rail vehicle.

By means of further sensor arrangements, which form a measuring section with the first sensor arrangement on both sides of the rail, the entire wheel profile of the rolling rail vehicle can be measured and analyzed, depending on the number of arrangements.

An embodiment of the invention also provides that a further non-contact measuring distance sensor in the form of an eddy current sensor is provided for measuring the wheel flange height. In the case of eddy current sensors, the required distance to the distance measurement between sensor and target object is less than in the case of radar sensors. Therefore, it is a good idea to place it in the area next to the rail head. The geometry characteristic value of the wheel flange height can then be calculated from the determined distance between the rail upper edge suitable as reference surface and the wheel flange. In order to here, too, determine the exact wheel flange height, the support of the measurement by the radar sensors on both sides of the rails is indispensable, since only this way, as described above, the movement of the wheel perpendicular to the longitudinal direction of the rails can be taken into account.

The larger the bandwidth, the better the resolution of the distance measurement by the radar sensors. An advantageous embodiment of the invention therefore provides that the radar sensors use microwaves in a frequency range of 1-300 GHz with a bandwidth of 1-4 GHz, preferably 4 GHz. Therefore, a frequency-modulated continuous wave radar or FMCW radar is particularly suitable for the runtime measurement for distance determination for the device according to the invention.

An accurate measurement of the wheel profile becomes possible by arranging the radar sensors at a distance of a ≥30 cm from the wheel to be measured. By selecting the bandwidth of the radar and/or the angle of incidence of the microwaves, it becomes possible to cover a large area of the wheel when passing the wheel to be measured with a sensor. By means of several sensor arrangements one behind the other or in series, it is also possible to form a measuring section with which the complete wheel circumference can be analyzed with regard to its geometry characteristic values, or also the wheel diameter.

The invention therefore provides a method for measuring and examining the wheel profile of a rolling wheel of a rail vehicle using a frequency-modulated continuous wave radar, which is provided for distance measurement. With this method, at least one radar sensor is directed at a defined angle onto the wheel surface of the rolling wheel that is to be measured. During the rolling process and the time Δt, the wheel surface ΔA is detected by the radar, the distances a between the distance sensor and the wheel surface are measured and finally, the geometry characteristic values for ΔA of the rolling wheel are calculated by the evaluation electronics.

An embodiment of the invention also provides that with the method for measuring and examining the wheel profile of a rolling wheel of a rail vehicle by means of a target/actual comparison of the geometry characteristic values of the rolling wheel, the wear state of the wheel can be represented.

Furthermore, an exemplary embodiment of the method provides that a warning message is issued when limit values are exceeded for the data from the target/actual comparison of the geometry characteristic values of the rolling wheel. This can take the form of visual or acoustic signals.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
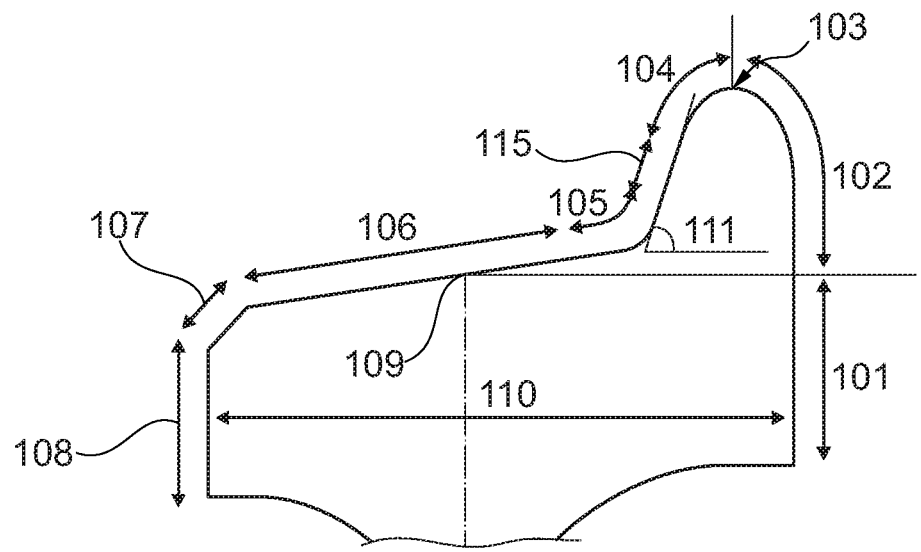
FIG. 1 and FIG. 2 each show a detail of a wheel of a rail vehicle
Figure 2:
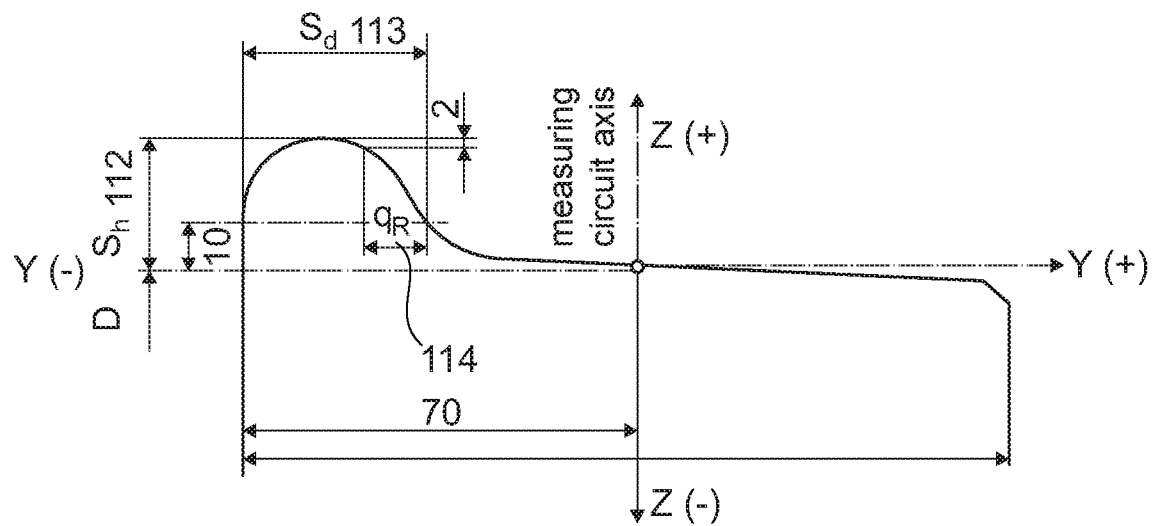

FIG. 1 and FIG. 2 show in each case a detailed section of a wheel of a rail vehicle and, to explain, the geometry characteristic values of a rail-bound wheel 1, wherein the wheel profile surface can be divided into the sections inner end face of the wheel or the wheel back 101, the back surface of the wheel flange 102, the wheel flange cap 103, the wheel flange top, 104, wheel flange flank 115, hollow groove 105, tread 106, bevel 107, and wheel rim end face 108.

Wheels of rail vehicles typically have a wheel flange in the form of a vertical bead about three centimeters high, which is located at the side of the wheels facing the center of the rail. The wheel flange cap 103 is adjoined by a wheel flange top 104, which is generally inclined by 70 degrees, and a wheel flange flank 115, before the wheel flange passes over the hollow groove 105 into the tread 106.

The distance between the two wheel flanges of a wheel set is called a track gauge. The entirety of the two wheels with wheel flanges, the wheel set shaft firmly connected to them, and, if necessary, the brake discs, is called wheel set. By means of the wheel flanges, the track play, within which the rail vehicle can move in the transverse direction, is limited in each case by a wheel flange run-up, that is, the running up of a wheel flange against the inner rail head (not shown). This ensures safe tracking, especially in the lower speed range.

A further reference point for the wheel geometry is the measuring circuit axis 109. This measuring circuit axis is arranged at a distance of 70 mm from the wheel back 101. The diameter of the measuring circle is therefore the wheel diameter at a distance of 70 mm from the wheel back 101. Accordingly, the wheel rim width 110 results from the distance between the wheel back 101 and the wheel rim end face 108. Without the aforementioned reference points of the wheel back 101 and measuring circuit axis 109, a determination of the geometry characteristic values of the wheel flange height $S_h$ 112, wheel flange width $S_d$ 113 and wheel flange gradient $q_r$, 114, which are decisive for determining the wear condition, is not possible. Therefore, it is of great importance how the measuring instruments and methods are chosen to measure these reference points. The geometry characteristic values are then calculated from the measured distances.

The wheel flange height $S_h$ 112 results, for example, from the distance between the tread 106 with reference to the measuring circuit axis 109 and the highest point of the wheel flange.

Figure 3:
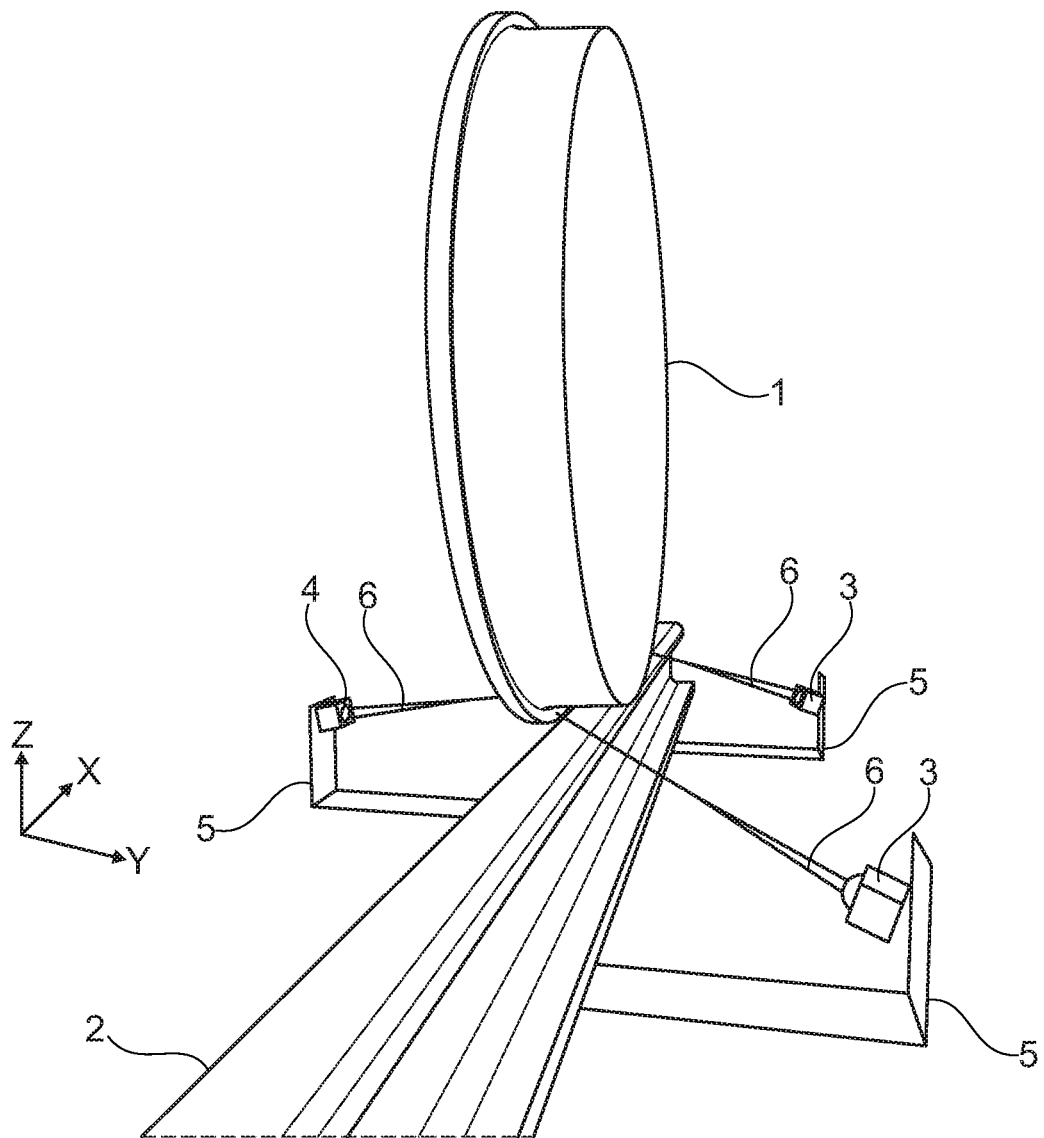
FIG. 3 shows a perspective view of a sensor arrangement of a device according to the invention

FIG. 3 shows a perspective view of a sensor arrangement according to a device according to the invention for determining geometry characteristic values of a wheel profile on a rolling wheel of a rail vehicle. In the region of a rail 2, two radar sensors 3 are arranged on a measuring path with a distance al from the rail 2 and a radar sensor 4 with a distance a from the rail 2. For this purpose, sensor holders 5 are provided on both sides of the rail 2, to which the radar sensors 3, 4 can be attached and aligned. In this case, the radar sensor 4 is directed to a reference surface of a rolling wheel 1 as it passes. The wheel back 101 of the wheel 1 is used as the reference surface. The two further radar sensors 3 are arranged on the opposite side of the rail 2 and are directed onto a surface ΔA of the wheel 1 facing the rail 2. In this case, care must be taken that the angle of incidence under which the microwaves or radar beams of the radar sensors 3, 4 are directed onto the corresponding wheel surface is precisely defined. Preferably, the scanning beam 6 of a radar sensor 3, 4 is directed at an angle of incidence of $0 \leq \alpha \leq 20°$ to the surface to be measured, preferably to the wheel flange flank 115. Otherwise, the measurement signals become too inaccurate in order to be able to perform an exact distance measurement. The surface to be measured is scanned with as small a measuring spot as possible in order to accurately scan the contour of the wheel profile. This is achieved with a suitable lens for focusing the radar waves.

During the passing of the wheel 1, a plurality of points on the wheel surface ΔA can be evaluated with the aid of a radar sensor 3. Via the radar sensor 4, which is directed at the wheel back 101, and the corresponding distance measurements between radar sensor 3 and wheel 1 or radar sensors 4 and wheel 1, the traveling characteristics of the associated railcar, mainly its movement horizontally to the rail direction X, the so-called hunting oscillation in the Y-direction, can be taken into account.

By virtue of the arrangement of a plurality of radar sensors 3, 4 in series on both sides of the rail 2, a complete wheel circumference of a wheel can accordingly be scanned during passing and appropriately evaluated with regard to its wear condition.

Figure 4:
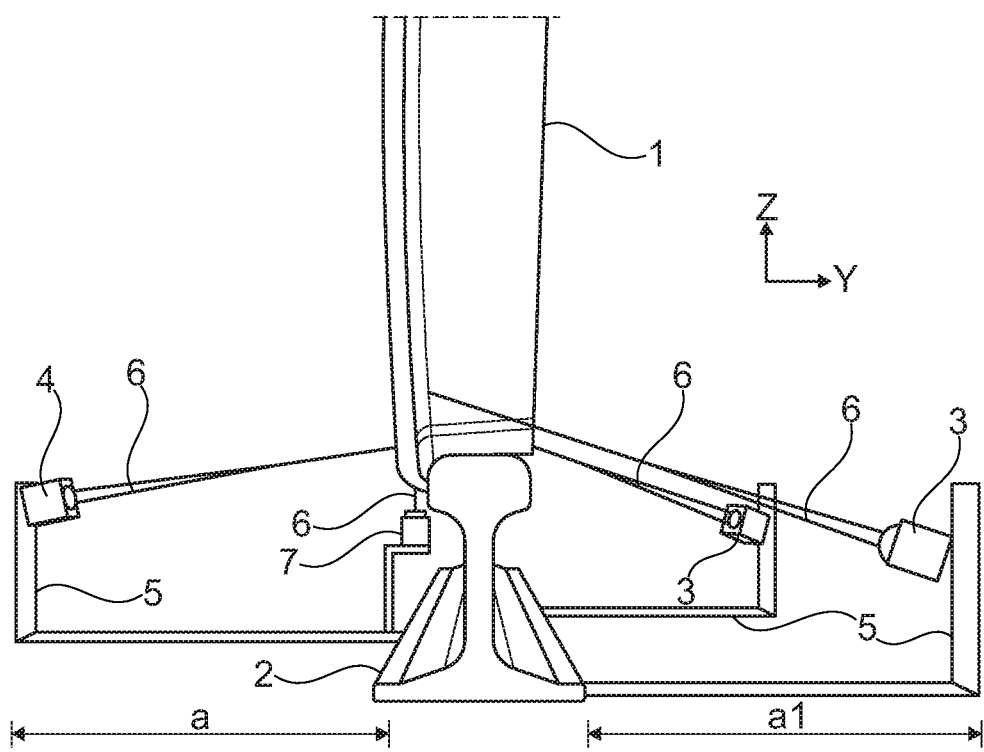
FIG. 4 is a view of a sensor arrangement according to FIG. 3

FIG. 4 shows a sensor arrangement of a device according to the invention for determining geometry characteristic values of a wheel from the front. In addition to the radar sensors 3, 4 on both sides of the rail, FIG. 3 shows a further non-contact measuring distance sensor 7 which is arranged below the wheel flange of the wheel. Since the distance sensor 7 can be arranged only at a small distance from its measurement points, the wheel flange cap 103 of a passing wheel 1, an eddy current sensor 7 is provided here, the scanning of which is directed vertically upwards. Since only a small minimum distance to the measuring object has to be maintained in the case of an eddy current sensor, this is more suitable for this distance measurement than a radar sensor. The distance between the eddy current sensor 7 and the highest point of the wheel flange can thus be determined from the signals of the eddy current sensor 7. The wheel flange height results from the measured distance to the wheel flange and the rail upper edge suitable as a reference surface.

When the distance signals are evaluated by the evaluation device (not shown), the distance measurements of the radar sensors 3, 4 are included, so that it can be ensured that the calculation of the geometry characteristic values has been made taking into account the track play or hunting oscillation.

The device according to the invention thus makes it possible to determine the state of wear of the wheels of a passing railcar or train, even in unfavorable weather conditions and especially during transit. The scanning rate can be adjusted to the speed of the train. It is thus possible, for example, to diagnose wheel profiles on traveling rail vehicles at a speed of 20 km/h on both sidetracks as well as on main routes in the high-speed range up to 200 km/h.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device for determining geometry characteristic values of a wheel profile on a rolling wheel of a rail vehicle, the device comprising:
   a first sensor arrangement having a first distance measuring sensor that is non-contacting and that is directed at a reference surface in the form of an inner planar surface of the rolling wheel, and having a second distance measuring sensor that is non-contacting and that is directed at a defined angle of incidence on a wheel surface of the rolling wheel facing a rail, wherein the first and second distance measuring sensors are arranged at a defined distance from the rail;
   an electronic evaluation device adapted to calculate geometry characteristic values of the wheel profile from the detected distance signals; and
   a display unit,
   wherein the first and second distance measuring sensors each utilize a frequency-modulated continuous wave (FMCW) radar, and
   wherein a lens is configured to bundle frequency-modulated continuous waves of the FMCW radars to define a measuring spot.

2. The device according to claim 1, wherein the second distance measuring sensor is directed at a tread, at a hollow groove, and/or or at a wheel flange flank of the rolling wheel.

3. The device according to claim 1, wherein the first distance measuring sensor is provided on a first side of the rail and the second distance measuring sensor preps provided on a second side of the rail.

4. The device according to claim 1, wherein at least one further sensor arrangement is provided, which forms a measuring path with the first sensor arrangement.

5. The device according to claim 1, wherein the first sensor arrangement further includes a third distance measuring sensor that is non-contacting, the third distance measuring sensor being an eddy current sensor, which is directed towards a wheel flange cap of the rolling wheel.

6. The device according to claim 1, wherein the FMCW is radars are provided with a frequency range of 1-300 GHz.

7. The device according to claim 6, wherein the FMCW is radars are provided with a bandwidth of 1-4 GHz.

8. The device according to claim 1, wherein FMCW is radars are each provided at a distance that is greater than or equal to 30 cm from the rail.

9. The device according to claim 1, wherein the first sensor arrangement further includes another one of the second distance measuring sensor, wherein the second distance measuring sensor and the another one of the second distance measuring sensor are directed on the wheel surface of the rolling wheel facing the rail at the same defined angle of incidence but are spaced apart from one another in a travel direction of the rail vehicle.

10. The device according to claim 1, wherein the first sensor arrangement is stationarily fixed to the rail.

11. A method for examining a wheel profile of a rolling wheel of a rail vehicle using a frequency-modulated continuous wave (FMCW) radar, which is provided for distance measurement, the method comprising:
   directing at least one FMCW radar sensor at a defined angle of incidence on a wheel surface to be measured of the rolling wheel;
   detecting the wheel surface and a time change during the rolling process via the at least one FMCW radar sensor; and
   processing the signals of the at least one FMCW radar sensor such that distances between the at least one FMCW radar sensor and the wheel surface are calculated.

12. The method according to claim 11, wherein geometry characteristic values of the wheel profile, including a wheel flange height, a wheel flange width and a wheel flange gradient are determined from the distances via an evaluating device.

13. The method according to claim 12, wherein a state of wear of the rolling wheel is determined and/or represented via a target/actual comparison of the geometry characteristic values of the rolling wheel.

14. The method according to claim 13, wherein a warning message is output when limit values for the state of wear determined from the target/actual comparison of the geometry characteristic values of the rolling wheel are exceeded.

* * * * *